United States Patent [19]

Beisswenger

[11] Patent Number: 4,471,205
[45] Date of Patent: Sep. 11, 1984

[54] ELECTRON BEAM ENGRAVING METHOD AND DEVICE FOR EXECUTION

[75] Inventor: Siegfried Beisswenger, Preetz, Fed. Rep. of Germany

[73] Assignee: Dr. Ing. Rudolf Hell GmbH, Fed. Rep. of Germany

[21] Appl. No.: 423,176

[22] Filed: Sep. 24, 1982

[30] Foreign Application Priority Data

Oct. 10, 1981 [DE] Fed. Rep. of Germany ..... 81108156

[51] Int. Cl.³ .............................................. B23K 15/00
[52] U.S. Cl. ...................... 219/121 EJ; 219/121 EK; 219/121 ES
[58] Field of Search .................. 219/121 LH, 121 LJ, 219/121 EJ, 121 EK, 121 ER, 121 ES, 121 EV

[56] References Cited

U.S. PATENT DOCUMENTS

| 3,246,079 | 4/1966 | Teucher | 178/6.6 |
| 4,028,523 | 6/1977 | Anderl et al. | 219/121 EK |
| 4,145,597 | 3/1979 | Yasuda | 219/121 ES |
| 4,243,866 | 1/1981 | Pfeiffer et al. | 219/121 EJ X |
| 4,245,159 | 1/1981 | Beisswenger | 250/396 |
| 4,393,295 | 7/1983 | Beisswenger | 219/121 |

FOREIGN PATENT DOCUMENTS

| 2111628 | 9/1972 | Fed. Rep. of Germany. |
| 2458370 | 6/1976 | Fed. Rep. of Germany. |
| 55965 | 5/1967 | German Democratic Rep.. |

Primary Examiner—C. L. Albritton
Attorney, Agent, or Firm—Hill, Van Santen, Steadman & Simpson

[57] ABSTRACT

In printing form production with electron beams, the imaging scale of the electron source on the source of the printing form is modulated gradation-dependent for engraving different cup geometries. The power density distribution in the effective point of the electron beam can then be approximately rectangular for all gradations. In particular, engraving the small cups, which was hitherto a vertical factor, is thus stable.

9 Claims, 3 Drawing Figures

ELECTRON BEAM ENGRAVING METHOD AND DEVICE FOR EXECUTION

BACKGROUND OF THE INVENTION

1. Field of the Invention

The present invention relates to a printing form engraving method using electron beams and apparatus by which a raster consisting of cup-shaped depressions, so-called raster cups, are engraved in rapid succession in the surface of a printing form, for example, a rotogravure cylinder, with the influence of an electron beam.

2. Description of the Prior Art

Methods for engraving printing forms with an electron beam are known from the DEAS No. 11 23 561, the DLLP No. 55 965, the DEOS No. 21 11 628 and the DEOS No. 24 58 370 with which raster cups having a great variety of shapes can be produced. The intensity focus position, energy distribution in the beam, movement of the focal point and influencing duration are controlled for producing different cup geometry.

It is particularly the low-volume raster cups which, in rotogravure, reproduce the light image passages which require a high constancy in production. The exact reproducibility of a cup geometry in the short time available (a few $\mu s$) is, altogether, one of the most difficult problems in electron beam engraving.

Experience has shown that one of the basic requirements for governing the light gradations requires a gradation-dependent change of the focus position on the surface of the printing form. The DEOS No. 24 58 370 describes such a method in which the focus position is controlled in such a manner that the focal point plane lies closer to the surface given small raster cups than given large raster cups. However, the method described proceeds from the fact that the electron beam deflects the continuous electron beam from the surface of the printing form by a so-called blanking system in the pauses between engraving two successive raster cups.

This method has the disadvantage that the electron beam is subject to certain recovery effects after returning to the surface of a printing form which make the engraving unstable.

The DEOS No. 29 47 444 discloses a method which no longer deflects the beam from the surface of the printing form but, while retaining its direction, only defocuses the beam to such a degree by a dynamic, magnetic lens in the pause between the engraving of two successive cups so that no processing effect occurs on the surface of the printing form. Because of the brevity of the time available, such defocusing and refocusing succeeds only with an additional dynamic focus coil as disclosed in the DEAS No. 27 52 598.

The above-mentioned coil, of course, can also accomplish the gradation-dependent focus swing required for engraving different cups, which is disclosed in the DEOS No. 24 58 370.

For this purpose, four large-volume cups, the narrowest cross section of the electron beam is placed on the surface of the printing form. A nearly rectangular current distribution occurs over the entire spot. For low-volume cups, the focus is placed somewhat above the surface of the printing form. Although the beam now has a far greater diameter at the surface than given focusing in the surface, the power density distribution in the beam at the surface is similar to a Gaussian distribution. Above all, the central "peak" has a higher power density than the rectangular energy distribution. When, given such an energy density distribution, the beam is permitted to influence the surface only briefly, then, as a result of the "peak", a cup with a small diameter and a low depth results in the center of the beam. Obviously, a threshold behavior of the processing operation is thereby exploited.

Practice has shown, however, that the threshold behavior is extremely difficult to maintain in a stable condition. Slight drift phenomena in the operating parameters of an electron beam gun, particularly thermal drifts, make it impossible to keep this threshold behavior stable for the entire time of engraving a rotogravure cylinder and it is precisely in light image passages (small cups) that the human eye is extremely sensitive to slight density fluctuations.

SUMMARY OF THE INVENTION

It is therefore the object of the present invention to provide a method which permits a long-duration constant engraving of all required gradations without employing the described, unstable threshold behavior for the gradation formation, and to provide apparatus for carrying out this method.

According to the invention, the above object is achieved in an electron beam engraving method for producing raster cups with different dimensions in the surface of a printing form, given which the raster cups arise as a result of the influence of a defocusable electron beam constantly directed onto the surface, with the electron beam being focused in or in the immediate proximity of the surface in its work position, in that, in addition to the influencing duration and the focus position, the imaging scale of the charge carrier source on the surface of the printing form is simultaneously controlled in dependence on the gradation.

According to another feature of the invention, large raster cups are produced with moderate electron-optical reduction of the charge carrier source and small raster cups are produced with high electron-optical reduction of the charge carrier source.

According to another feature of the invention, the power density distribution in the electron beam is nearly rectangular both for large and small raster cups.

According to another feature of the invention, in addition to the imaging scale, the power density distribution of the electron beam is also controlled in dependence on gradation.

According to another feature of the invention, in addition to a primary lens system, at least two further lens systems are disposed in the beam path of the electron gun, and the excitation of the lens is variable in accordance with the gradation.

According to another feature of the invention, an aperture stop is disposed between the primary lens system and one of the secondary lens system.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
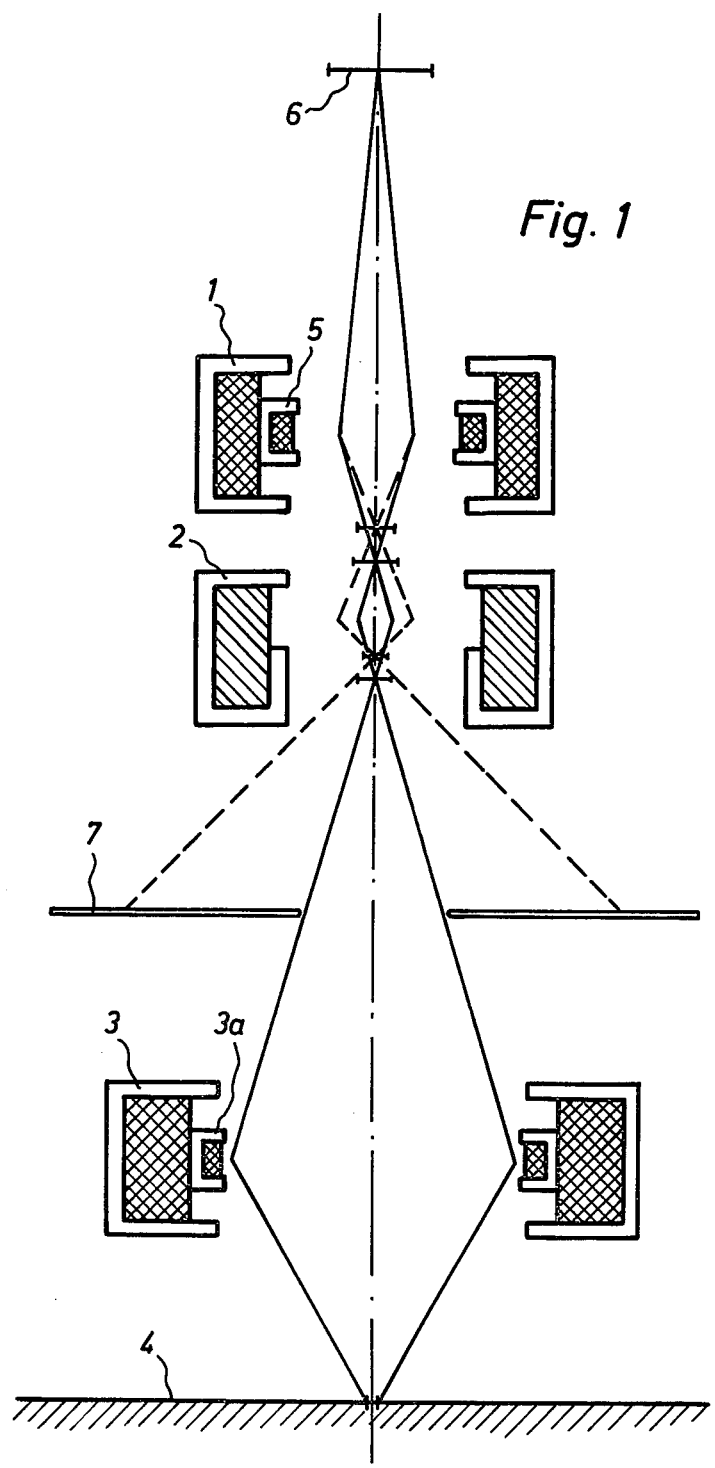
FIG. 1 is a schematic representation of an engraving system for practicing the present invention.

Referring to FIG. 1, a three-stage reduced imaging of an electron source by way of magnetic lenses is undertaken. To this end, a first, long focal length lens 1 is combined with a second short focal length lens 2. A third lens 3 has a long focal length and enables a high working distance to the surface of a printing form 4; it corresponds to the principle lens of the previously-known electron beam gun and is combined with a dynamic lens 3a as disclosed in DEAS No. 27 52 598, fully incorporated herein by this reference. An identical dynamic lens 5 is disposed in the first long focal length lens 1. Given excitation of the lens 5, the image distance of the first long focal length lens 1 is changed by a slight amount. Thereby, the imaging scale of the lens combination 1, 5 is only slightly changed. Since, however, the imaging of the electron source 6 through the combination of the lens 1 and the lens 5 represents the subject of the second short focal length lens 2, a slight axial displacement of the first intermediate image leads to a greater change of the imaging scale of the lens 2. The imaging scale of the lens combination 3, 3a is only changed very slightly due to the displacement of the second intermediate image. The error in the focus position on the surface of the printing form 4 which results can be compensated by changing the adjustment of the dynamic lens 3a.

Assuming a numerical example, when, for example, the lens 1 reduces three-fold and when the lens 5 therein is not excited, then the second short focal length lens 2 can be set in such a manner that it produces a scale ratio of 1. When the lens 3 then produces a scale ratio of 4, then the overall reduction is equal to 12. In FIG. 1 the resultant beam path is illustrated in solid lines. When the lens 5 disposed in the lens 1 is now excited, then the first intermediate image is displaced closer to the lens combination 1, 5. At the same time, the object distance of the second short focal length lens 2 becomes greater. This means that the short focal length lens 2, given unaltered excitation, now exhibits an imaging scale of, for example, 3. Thus, the overall reduction scale of the arrangement has changed to 36. The resultant beam path in FIG. 1 is illustrated with broken lines.

When an aperture stop 7 is disposed behind the short focal length lens 2 then, in addition to the modulation of the imaging scale, a modulation of the beam energy also occurs.

As a result, it is possible to guarantee both small and large cups with approximately the same power density.

Figure 3:
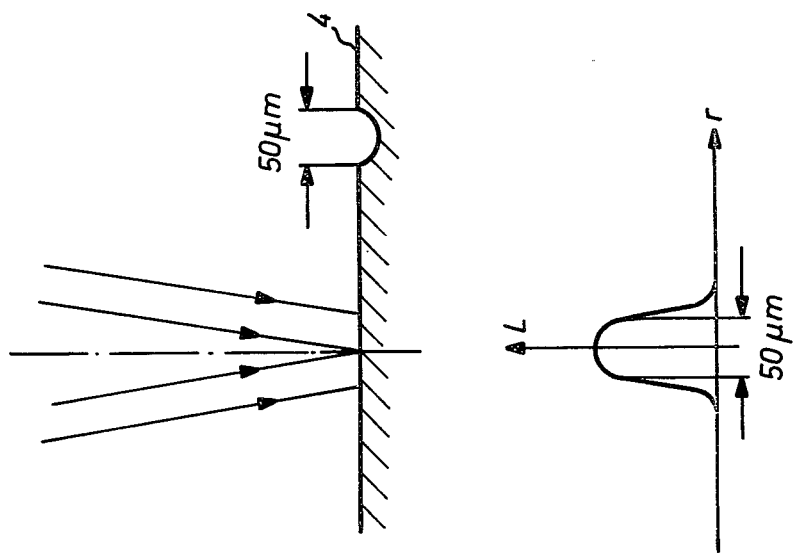
FIG. 3 is a graphic illustration of the focus condition for engraving small cups.
Figure 2:
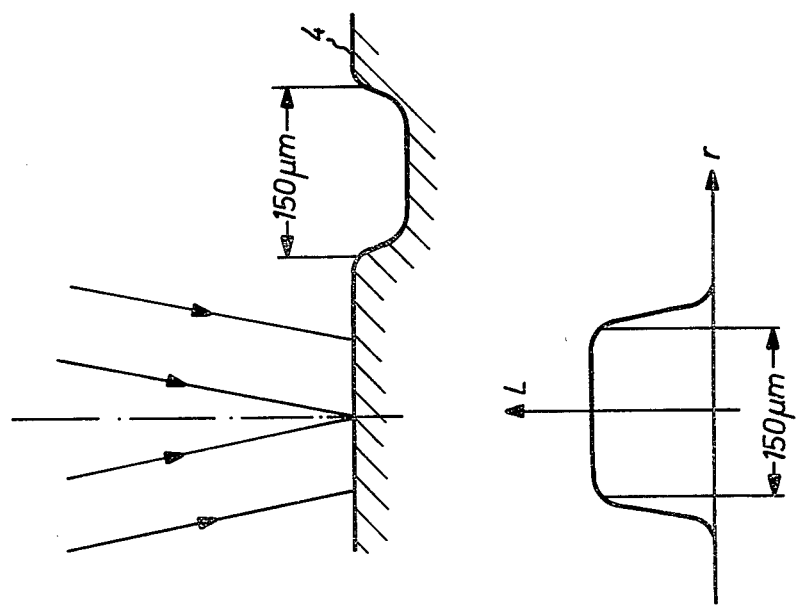
FIG. 2 is a graphic illustration of the focus conditions for engraving large cups.

The focus condition at the effective point of the beam for large cups are illustrated in FIG. 2 and the focus conditions at the effective point of the beam for small cups are illustrated in FIG. 3. In FIGS. 2 and 3 the beam power density L and the radius r at the effective point are illustrated. A few dimensions have been entered on the drawing as a point of reference in FIG. 2 in order to provide an idea of the dimensions.

The described arrangement enables a very fast change of the imaging scale. The adjustment time when changing from higher to lower reduction and vice versa can be executed in accordance with the arrangement of the present invention in approximately 1 μs.

The excitation of the lens 5 lies on the same order as likewise required for the unsharp keying of the beam in the engraving pause between two successive cups disclosed in the DEOS No. 29 47 444, fully incorporated herein by this reference.

The invention can be advantageously employed in an engraving printing forms with electron beams. It can also be employed where material processing of any type whatsoever is required, such as welding, boring, engraving, heating, etc, which is carried out with charge carrier beams. In addition, it can also be employed in the field of electron beam lithography.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In an electron beam engraving method of the type, in which raster cups of different dimension are produced in the surface of a printing form as a result of the application of a defocusable electron beam, from a charge carrier source, constantly directed at the surface and focused in or in the immediate proximity of the surface in its work position, the improvement therein comprising the steps of:
   controlling the duration of focus and the focus position; and
   simultaneously controlling image scale of the charge carrier source on the printing form in accordance with the desired gradation of raster cup dimension.

2. The improved method of claim 1, wherein the step of controlling the image scale is further defined as:
   producing large raster cups by moderately reducing the scale of the charge carrier source; and
   producing small raster cups by highly reducing the scale of the charge carrier source.

3. The improved method of claim 2, and further comprising the step of:
   controlling the power density distribution of the electron beam to be rectangular for both large and small raster cups.

4. The improved method of claim 1, and further comprising the step of:
   controlling the power density distribution of the electron beam in accordance with the desired gradation.

5. In an electron beam erosion method of the type in which different degrees of erosion are produced in a surface as a result of the application of a defocusable electron beam, from a charge carrier source, constantly directed at the surface and focused in or in the immediate proximity of the surface in its work position, the improvement therein comprising the steps of:
   controlling the duration of focus and the focus position; and
   simultaneously controlling the image scale of the charge carrier source on the surface in accordance with the desired gradation of degress of erosion.

6. A device for electron beam engraving raster cups of different dimensions in the surface of a printing form by controlling an electron beam along a path extending from an electron beam source to the printing form, comprising: a principle electro-optical lens system located along the beam path and operable to provide an imaging scale and control the focus position of the electron beam on the surface; and first and second other electro-optical lens systems disposed along the beam path between the source and said principle lens system and operable to change their imaging scales and therefore control the total image reduction.

7. The device of claim 6, and further comprising: means defining an aperture stop disposed between said principle lens system and said second other lens system.

8. A device for electron beam erosion of different degrees in the surface of an element by controlling an electron beam along a path extending from an electron beam source to the element, comprising:

a principle electro-optical lens system located along the beam path and operable to provide an imaging scale and control the focus position of the electron beam on the surface, of the element; and first and second other electro-optical lens systems disposed along the beam path between the source and said principle lens system and operable to change their imaging scales and therefore control the depth of beam focus position in the element.

9. The device of claim 8, and further comprising: means defining an aperture stop disposed between said principle lens system and said second other lens system.

* * * * *